United States Patent [19]
Dykes

[11] Patent Number: 6,122,216
[45] Date of Patent: Sep. 19, 2000

[54] SINGLE PACKAGE DUAL MEMORY DEVICE

[75] Inventor: Don Dykes, Houston, Tex.

[73] Assignee: Compaq Computer Corporation, Houston, Tex.

[21] Appl. No.: 09/208,306

[22] Filed: Dec. 9, 1998

[51] Int. Cl.[7] .................................................. G11C 8/00
[52] U.S. Cl. ........................................ 365/230.03; 365/63
[58] Field of Search ............................. 365/230.03, 195, 365/185.08, 51, 63, 230.05

[56] References Cited

U.S. PATENT DOCUMENTS

| | | | |
|---|---|---|---|
| 3,753,242 | 8/1973 | Townsend | 340/172.5 |
| 4,004,286 | 1/1977 | Mrazek | 340/173 R |
| 4,095,281 | 6/1978 | Denes | 365/156 |
| 4,149,268 | 4/1979 | Waters | 365/95 |
| 4,175,290 | 11/1979 | Harari | 365/156 |
| 4,207,615 | 6/1980 | Mar | 365/95 |
| 4,418,401 | 11/1983 | Bansal | 365/95 |
| 4,485,457 | 11/1984 | Balaska et al. | 364/900 |
| 4,575,819 | 3/1986 | Amin | 365/104 |
| 4,584,669 | 4/1986 | Moynihan et al. | 365/95 |
| 4,601,031 | 7/1986 | Walker et al. | 371/10 |
| 4,610,000 | 9/1986 | Lee | 365/189 |
| 4,638,465 | 1/1987 | Rosini et al. | 365/228 |
| 4,855,803 | 8/1989 | Azumai et al. | 357/45 |
| 4,897,813 | 1/1990 | Kumbasar | 365/49 |
| 4,942,516 | 7/1990 | Hyatt | 364/200 |
| 4,995,004 | 2/1991 | Lee | 365/189.11 |
| 5,014,982 | 5/1991 | Okada et al. | 273/435 |
| 5,138,598 | 8/1992 | Sako et al. | 369/47 |
| 5,581,505 | 12/1996 | Lee | 365/189.11 |
| 5,687,346 | 11/1997 | Shinohara | 395/430 |
| 5,710,934 | 1/1998 | Bona et al. | 395/800 |
| 5,715,232 | 2/1998 | Chikazawa et al. | 369/275.2 |

OTHER PUBLICATIONS

*Microelectronic Circuits*, Third Edition, 1991, Saunders College Publishing, Harcourt Brace College Publishers, pp. 956–970.

*SmartVoltage Boot Block Flash Memory Family*, Intel®, A28F400BR–T/B, R–MBIT (256K X 16, 512K X 8), Dec. 1996.

*Primary Examiner*—A. Zarabian
*Attorney, Agent, or Firm*—Conley, Rose & Tayon, P.C.; Michael F. Heim; Jonathan M. Harris

[57] ABSTRACT

A dual function memory device having a RAM array and a ROM array contained in a single integrated circuit package. Preferably the RAM cells are static RAM cells, and the ROM cells are flash ROM. Either the RAM cells or the ROM cells, but not both, can be accessed during a single memory transaction. The memory device includes a ROM select signal that determines selects the operating mode for the memory. When the ROM select is asserted, the ROM cells can be accessed so that the memory device operates as a ROM. When the ROM select signal is deasserted, the RAM cells can be accessed so that the memory device operates as a RAM. The RAM and ROM arrays connect to a common address bus and thus occupy separate address spaces. The RAM and ROM arrays also connect to a common data bus and may share a plurality of control signals.

26 Claims, 3 Drawing Sheets

SINGLE PACKAGE DUAL MEMORY DEVICE

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to an integrated memory device and particularly to memory circuits comprising multiple types of memory. More particularly, the present invention relates to an integrated circuit memory device comprising random access memory and read only memory in a single package.

2. Background of the Invention

Most electronic systems such as computers, calculators, watches, physiological monitors and most types of consumer electronics have circuit boards in which electronic components are mounted. The size of the circuit board generally dictates how many components can be mounted on it. Often, the number of features that can be incorporated into an electronic device depends on the number of electronic components that can fit on the circuit board. Thus, a major design consideration in many electronic systems is the circuit board area, or "real estate," available for holding electronic components. For example, increasing the amount of memory in a computer can enable the computer to run larger, more complex application programs but often requires adding extra memory chips, which occupy circuit board space. In some electronic systems, the circuit board size may be increased to add functionality. In other systems where space is a premium, however, the circuit board area cannot be increased. For example, portable and handheld computers, calculators, handheld video games, and computer expansion cards such as Personal Computer Memory Card International Association (PCMCIA) cards (or "PC-cards"), have a limited amount of space that can be allocated to circuit boards and other system components.

A common electronic component known as an integrated circuit (IC) is manufactured by etching interconnected transistors onto a semiconductor die. Conductive metallic leads are then connected to selected portions of the circuit, and the semiconductor is encased in a shell made of metal, plastic, ceramic, or other material. The resulting IC "package" can be mounted onto a printed circuit board and connected to other IC's and electronic devices via the package leads. Transistors can be etched microscopically small and packed closely together, resulting in a relatively small semiconductor die. Because IC's must be mounted (or "stuffed") onto printed circuit boards either by hand or by machine, however, the package size and leads must be large enough to be easily handled. Consequently, typical IC packages are much larger than the actual semiconductor die, leaving empty space within the IC package.

Many microprocessor or microcontroller-based electronic devices require a standard set of "glue logic" IC's to augment and support the functions of the microprocessor. Examples of such glue logic IC's include memory devices like read only memory (ROM), random access memory (RAM), input/output chips, and analog/digital converters. For such a system to fit onto a small circuit board, such as that of a PC-card, a significant amount of real estate is required simply for the glue logic, leaving precious little space for additional circuitry.

U.S. Pat. No. 4,095,281 attempts to alleviate the tradeoff between limited circuit board space and the number of IC's desired to mounted on the board by disclosing a memory cell for storing a single binary digit (or "bit") of data that may operate in both ROM and RAM modes. A single memory device may incorporate an array of these combination memory cells, so that RAM and ROM functions are included within a single IC package. Previous memory devices generally included only one type of memory technology, requiring circuit boards to include separate IC packages for RAM and ROM. The combination memory cells can thus reduce the circuit board area that must be allocated for memory.

A potential disadvantage to the patent is that each memory cell requires a larger number of transistors than most conventional RAM and ROM cells. A typical ROM cell requires a single transistor, while a typical RAM cell may require up to four transistors. The patented combination memory cell requires anywhere from six to eight transistors per cell, however, possibly increasing the cost of manufacturing the device significantly. In addition, a large number of the transistors may be essentially wasted if some memory cells are used only for RAM or only for ROM.

U.S. Pat. Nos. 4,004,286, 4,575,819, 4,855,803, and 4,995,004 generally disclose memory cells capable of operating as either RAM or ROM. The particular ROM cells disclosed by these patents are permanent ROM's. Designers often prefer programmable ROM devices over permanent ROM devices, however, because programmable ROM's allow the designers to change the ROM contents when developing electronic systems that use ROM. Programmable ROM's also permit efficiently upgrading existing systems in the field.

U.S. Pat. Nos. 3,753,242 and 4,610,000 generally disclose devices that contain RAM and ROM portions. In U.S. Pat. No. 3,753,242, the RAM is divided into a plurality of memory segments, each of which is the same size as the ROM. The ROM is then used as a replacement for one of the RAM segments, so that the ROM handles memory requests directed to the replaced RAM segment. Because the replaced RAM segment cannot be accessed during a memory transaction, the RAM and ROM share the same address space, meaning that any particular memory address may correspond to either the RAM or the ROM, but not both. Because the ROM must have the same storage capacity as only one segment of the RAM, the size of the ROM is thereby limited to a fraction of the size of the RAM. As a result, the device requires extensive and costly decoding circuitry to determine whether an address is directed to RAM or ROM.

U.S. Pat. No. 4,610,000 teaches a read only memory that incorporates a special "patch" ROM and a special "patch" RAM. The patch memories are used to update the main ROM data, which is permanently encoded. To update a particular location in the main ROM, data are written to a corresponding location in the patch memory, which is thereafter accessed in lieu of the updated main ROM location. The system requires that the patch memories share an address space with the main ROM, however, requiring extensive control circuitry to determine which memory device to access for each memory transaction.

Accordingly, there is a need for a space-efficient memory device that incorporates multiple types of memory technologies in a single IC package. Preferably, the IC package and transistor technologies used for the device should conform to common industry standards, in order to minimize the cost of volume production. Further, the device should possess a standard signal interface to ensure compatibility with a wide array of memory systems and should not require extensive decoding and control circuitry. Despite the apparent advantages that such a memory device would provide, to date, no such device has been developed that provides these features.

SUMMARY OF THE INVENTION

Accordingly, the present invention discloses a dual function memory device that includes a RAM array and a separate ROM array. Either the RAM cells or the ROM cells, but not both, can be accessed during a single memory transaction. The memory device includes a ROM select signal that determines the operating mode for the memory. When the ROM select is asserted, the memory device operates as a read only memory. When the ROM select signal is deasserted, the memory device operates as a random access memory.

The memory device preferably comprises a single, low-profile IC package to minimize required circuit board area, utilizes standard materials to lower volume manufacturing costs, and includes a standard interface to ensure compatibility with existing devices. In addition, the RAM array and ROM array preferably occupy different semiconductor dies that are manufactured using standard transistor-level manufacturing techniques, or "founding processes." Because the two memories comprise standard transistor technologies, the semiconductor dies can be mass produced relatively inexpensively. For added flexibility, however, the memory device may incorporate virtually any type of memory technologies, including one or more nonstandard memory technologies. The use of a dual function memory device in a single package saves valuable circuit board area in microprocessor and microcontroller-based systems that traditionally required two circuit packages, one for RAM and another for ROM. The circuit package preferably comprises a thin small outline package (TSOP) or other standard package used for memory devices, ensuring both a low profile and also compatibility with a wide variety of existing electronic systems and design tools. Further, the RAM array and ROM array couple to a common set of address signals so that the RAM and ROM occupy separate address spaces. Since only one of the memories is active during a given memory transaction, the RAM and ROM array couple to a common data bus, thus saving valuable signal lines. The RAM and ROM may also couple to a common set of control lines, including a chip enable signal, a write enable signal, an output enable signal, and other control signals.

The dual function memory device may be used in a variety of microprocessor and microcontroller-based systems but is especially useful for compact and portable devices that have limited room for circuit board components. Such devices may include PCMCIA cards such as modems, cellular phones, and various types handheld computing devices, for example.

Thus, the present invention comprises a combination of features and advantages that enable it to substantially advance the art by providing a cost-efficient, standardized, and space-efficient memory device. These and various other characteristics and advantages will be readily apparent to those skilled in the art upon reading the following detailed description of the preferred embodiments and by referring to the accompanying drawings.

BRIEF DESCRIPTION OF THE DRAWINGS

A better understanding of the present invention can be obtained when the following detailed description of preferred embodiments is considered in conjunction with the following drawings, in which.

DETAILED DESCRIPTION OF THE PREFERRED EMBODIMENTS

Figure 1:
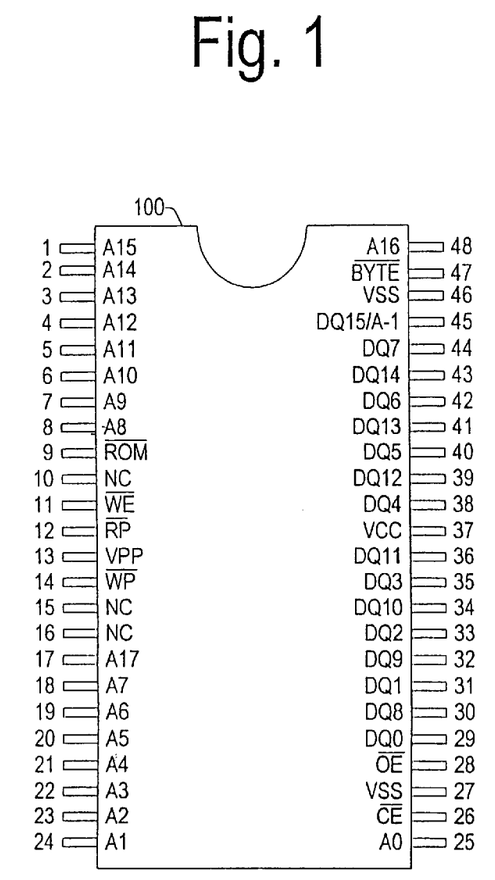
FIG. 1 illustrates the pinout of an integrated circuit package for enclosing a memory device constructed in accordance with a preferred embodiment.

FIG. 1 illustrates an exemplary package outline of an integrated circuit (IC) 100 implementing a dual function memory in accordance with the preferred embodiment. The IC 100 preferably provides two different memory technologies in one circuit package: random access memory (RAM) and flash memory. It should be understood that any number or type of memory technologies may be used, although this disclosure focuses on a dual function flash and RAM device in order to clarify the structure and function of the embodiments. One of ordinary skill in the art, upon reading this disclosure, would immediately recognize how to design an integrated circuit containing three or more different types of memory conforming to any desired memory technologies. Further, the principles described herein permit the use of memory technologies not yet developed at the time of this disclosure. Hence, the term "standard memory technology" in this disclosure refers to any particular memory technology commonly used in the art at the present time or in the future.

Figure 2:
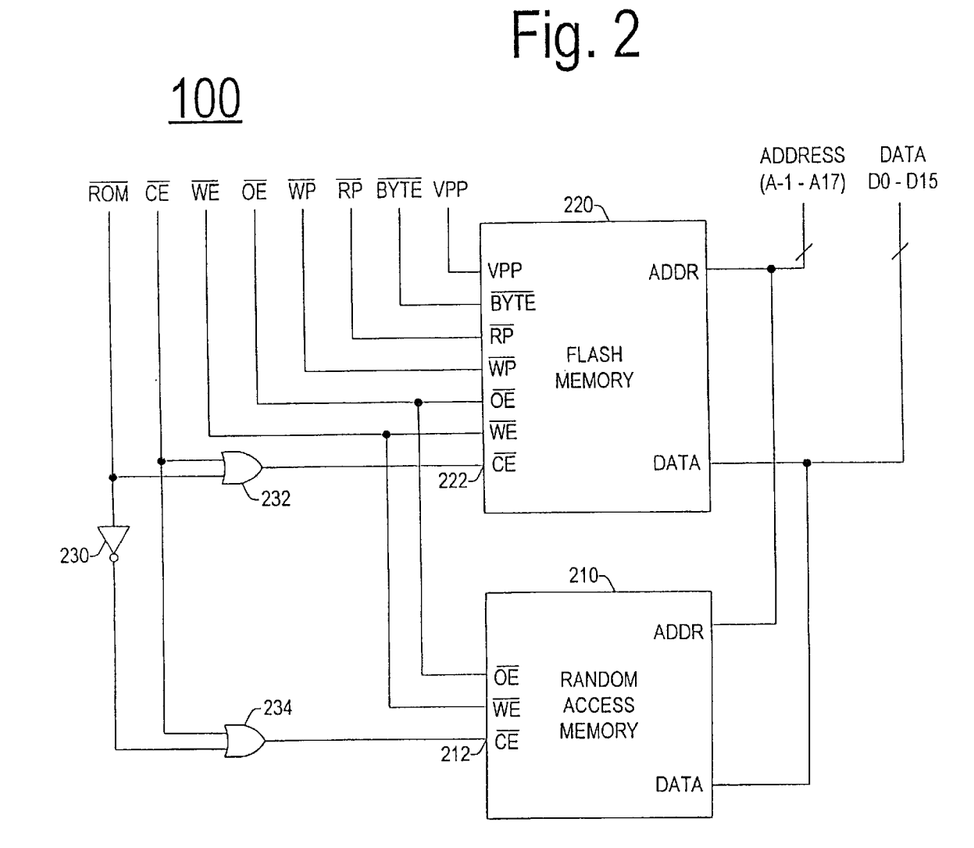
FIG. 2 illustrates the schematic of a preferred embodiment of the integrated circuit package of FIG. 1 comprising random access memory and flash memory.

FIG. 2 illustrates a block diagram of the contents of IC package 100, including a flash memory 220 and a random access memory 210. The RAM 210 and flash memory 220 preferably provide equal amounts of storage and thus couple to a common set of address and data lines. In a preferred embodiment, memories 210 and 220 each include storage capacity of 4 million bits (or 4 megabits), although any memory size is acceptable. It should be understood, however, that memories 210 and 220 may have unequal storage capacities if desired. RAM 210 and ROM 220 preferably are constructed on separate semiconductor dies, although any number of dies may be used without departing from the principles described herein. Such dies are standard in the art and thus permit relatively inexpensive volume production of the memory chip 100. In addition, using a separate die for each memory 210 and 220 permits manufacturing the RAM 210 to operate at a different access speed than the ROM 220.

RAM 210 preferably comprises an array of static RAM (SRAM) cells, although alternative embodiments may include any desired memory technology such as dynamic RAM (DRAM), synchronous DRAM (SDRAM), extended data output RAM (EDO RAM), or synchronous graphics RAM (SGRAM). Further, RAM 210 may comprise a mix of different memory technologies and may be constructed using volatile, nonvolatile, or a mix of volatile and nonvolatile RAM cells, as desired.

Flash memory 220 preferably comprises a standard flash electrically erasable programmable read only memory (EEPROM) array, although alternative embodiments may include any desired memory technology such as conventional read only memory (ROM), programmable ROM (PROM), erasable PROM (EPROM), or conventional EEPROM, for example. Further, flash memory 220 may comprise a mix of different memory technologies, as desired. In an alternative embodiment, RAM 210 comprises read only memory cells, preferably a different memory technology than that used for flash memory 220. Similarly, flash memory 220 comprises random access memory cells in another alternative embodiment, preferably a different memory technology than that used for RAM 210.

One of ordinary skill in the art would immediately recognize how to construct these and other types of RAM and flash memory cells. For a description of various types of random access memory and read only memory cells, including SRAM and EEPROM cells, refer to *Microelectronic Circuits* by Sedra and Smith (Saunders College Publishing, 1991 pages 956–970). It should be noted, however, that these memory technologies are well known to those of ordinary skill the art. Further, semiconductor dies containing SRAM and flash memory are standard in the industry and are well-suited for inexpensive, high volume production.

Referring again to FIG. 1, the IC 100 preferably is housed in a 48-pin Thin Small Outline Package (TSOP), type I, and thus conforms to a popular industry standard for packaging flash memory IC's. It should be understood that the principles of this disclosure are not limited by any particular package type, although the package preferably conforms to a standard package outline and has a low dimensional profile. A standard package outline ensures compatibility with a wide variety of existing systems and also lowers manufacturing costs. Examples of other industry standard package styles used for flash memory include the TSOP type II and Plastic Small Outline Package (PSOP). These and other industry standard package styles are defined by the Joint Electron Device Engineering Council (JEDEC), based in Arlington, Va. Dimensional specifications for the TSOP type I package outline can be found in JEDEC Publication No. 95, Section 1, item MO-142.

As illustrated in FIGS. 1 and 2, pins 1–48 preferably implement a standard memory interface comprising a plurality of power terminals (VCC and VSS), data lines ($DQ_0$–$DQ_{15}$), address lines ($A_1$–$A_{16}$), and control signals. The VCC pin preferably receives a power supply voltage of 5 volts direct current (VDC), and VSS represents ground, or 0 VDC. Other supply voltages may be used in alternative embodiments, however. The control signals include byte enable ($\overline{BYTE}$), write enable ($\overline{WE}$), output enable ($\overline{OE}$), write protect ($\overline{WP}$), ROM select ($\overline{ROM}$), chip enable ($\overline{CE}$), reset/power down ($\overline{RP}$), and program/erase (VPP). As one of ordinary skill in the art would realize, the power, address, and control signals comprise input signals, while the data signals may be used either as input signals (during a memory write transaction) or output signals (during a memory read transaction). Table I, below, defines which pins carry the data, address, and control signals of IC 100 in a preferred embodiment of IC 100. Because the pinout defined by Table I is widely used in the industry, the IC 100 is compatible with a wide variety of printed circuit board designs and computer aided design (CAD) tools.

TABLE I

Dual memory device pinout.

| Symbol | Pin | Type | Description |
| --- | --- | --- | --- |
| $A_{15}$ | 1 | Input | Most significant Address bit |
| $A_{14}$ | 2 | Input | Address |
| $A_{13}$ | 3 | Input | Address |
| $A_{12}$ | 4 | Input | Address |
| $A_{11}$ | 5 | Input | Address |
| $A_{10}$ | 6 | Input | Address |
| $A_9$ | 7 | Input | Address |
| $A_8$ | 8 | Input | Address |
| $\overline{ROM}$ | 9 | Input | ROM Enable |
| NC | 10 | N/A | Not Connected |
| $\overline{WE}$ | 11 | Input | Write Enable |
| $\overline{RP}$ | 12 | Input | Reset/Power Down |
| VPP | 13 | Input | Program Erase |
| $\overline{WP}$ | 14 | Input | Write Protect |
| NC | 15 | N/A | Not Connected |
| NC | 16 | N/A | Not Connected |
| $A_{17}$ | 17 | Input | Address |
| $A_7$ | 18 | Input | Address |
| $A_6$ | 19 | Input | Address |
| $A_5$ | 20 | Input | Address |
| $A_4$ | 21 | Input | Address |
| $A_3$ | 22 | Input | Address |
| $A_2$ | 23 | Input | Address |
| $A_1$ | 24 | Input | Address |
| $A_0$ | 25 | Input | Least significant Address bit during word mode |
| $\overline{CE}$ | 26 | Input | Chip Enable |
| VSS | 27 | Input | Ground (0 VDC) |
| $\overline{OE}$ | 28 | Input | Output Enable |
| $DQ_0$ | 29 | Input/Output | Least significant Data bit |
| $DQ_8$ | 30 | Input/Output | Data |
| $DQ_1$ | 31 | Input/Output | Data |
| $DQ_9$ | 32 | Input/Output | Data |
| $DQ_2$ | 33 | Input/Output | Data |
| $DQ_{10}$ | 34 | Input/Output | Data |
| $DQ_3$ | 35 | Input/Output | Data |
| $DQ_{11}$ | 36 | Input/Output | Data |
| VCC | 37 | Input | Power Supply (5 VDC) |
| $DQ_4$ | 38 | Input/Output | Data |
| $DQ_{12}$ | 39 | Input/Output | Data |
| $DQ_5$ | 40 | Input/Output | Data |
| $DQ_{13}$ | 41 | Input/Output | Data |
| $DQ_6$ | 42 | Input/Output | Data |
| $DQ_{14}$ | 43 | Input/Output | Data |
| $DQ_7$ | 44 | Input/Output | Most significant Data bit during byte mode |
| $DQ_{15}/A_{-1}$ | 45 | Input/Output | Most significant Data bit during word mode/Least significant Address bit during byte mode |
| VSS | 46 | Input | Ground (0 VDC) |
| $\overline{BYTE}$ | 47 | Input | Byte Mode Enable |
| $A_{16}$ | 48 | Input | Most significant Address bit |

To ensure compatibility with standard memory protocols, the byte enable, write enable, output enable, write protect, ROM select, chip enable, and reset/power down control signals preferably comprise active low signals. These control signals are thus said to be "asserted" at a logic low voltage level or "deasserted" at a logic high level. An alternative embodiment could include active high signals or mixed active high and active low signals, as desired.

The data bus signals, denoted by the symbols $DQ_0$–$DQ_{15}$, carry data to the memory device 100 during write transactions and carry data from the memory device 100 during read transactions. The address bus signals, denoted by the symbols $A_{-1}$–$A_{17}$ designate the location of the memory transaction, commonly known as the memory address, within the memory 100. Hence, the memory address specifies the location to store data during a memory write transaction or the exact location from which to retrieve data during a memory read transaction.

The ROM select signal is asserted to access the flash memory 220 or deasserted to access RAM 210 during a particular memory transaction. Accordingly, any value that is encoded on the address lines represents an address to either the RAM 210 or flash memory 220, depending on the setting of the ROM select signal. If the ROM select signal is asserted, then the value of the address lines represents a location within flash memory 220. If the ROM select signal is deasserted, then the value of the address lines represents a location within RAM 210. Similarly, the ROM select signal determines whether the data lines carry information to the RAM 210 or to the flash memory 220. If the ROM select signal is asserted, then the data lines carry flash memory 220 data signals. If the ROM select signal is deasserted, then the data lines carry RAM 210 data signals. Because the RAM 210 and flash memory 220 respond to the same set of address values, any particular address value that is placed on the address lines can be directed either to RAM 210 or to flash memory 220, and the RAM 210 and flash memory 220 therefore are said to occupy separate "address spaces." In essence, the presence of the ROM select signal indicates that RAM 210 and ROM 220 reside in separate address spaces. In alternative embodiments, the RAM 210 and flash memory 220 may occupy the same address space, in which a portion of the available memory addresses are allocated for RAM 210, and the remaining addresses are allocated for flash memory 220.

The chip enable signal is asserted prior to a read or write transaction in order to activate internal circuitry (not shown) within semiconductor memories needed for accessing the memory cells. Such circuitry may include control logic circuitry, input buffers, decoders, and sense amplifiers, for example. As one of ordinary skill in the art would recognize, the ROM select and chip enable lines may be replaced by a pair of dedicated chip enable lines, one of which is connected to the chip enable terminal of the RAM 210, and the other connected to the chip enable terminal of the ROM 220. The configuration illustrated in FIG. 2, however, prevents the chip enable terminals of the RAM 210 and ROM 220 from becoming asserted simultaneously.

The byte enable signal specifies one of two data operating modes: "byte mode" or "word mode." When operating in the byte mode, the memory device utilizes only the 8 least significant data lines ($DQ_0$–$DQ_7$) and all 19 of the address lines ($A_{-1}$ through $A_{17}$). When operating in the word mode, the memory device 100 utilizes the fall set of 16 data lines ($DQ_0$–$DQ_{15}$) and the 18 most significant address lines ($A_0$–$A_{17}$). Note that pin 45 is used as a data signal ($DQ_{15}$) during word mode or as an address signal ($A_{-1}$) during byte mode. The byte enable signal is asserted to indicate byte mode or deasserted to indicate word mode.

The write enable signal indicates whether a memory transaction represents a read cycle or a write cycle. When asserted, the write enable permits writing data to the memory device 100. When deasserted, the write enable signal indicates a read transaction. Asserting the output enable signal activates internal output buffers in both memories 210 and 220 (not shown) that drive the data lines during a memory read cycle.

Flash memories typically include regions of protected memory cells for storing data and instructions that normally do not change, such as boot code. The write protect control signal is provided to the flash memory to safeguard these protected memory regions. The write protect signal, when asserted, prevents writing data to protected flash memory regions. The program/erase signal is asserted to protect flash memory regions which are not protected by the write protect signal. The program/erase signal must be deasserted to permit programming, or writing data to, these regions. Accordingly, the write protect signal remains asserted during normal flash memory operation. The reset/power down signal, when asserted, resets and powers down the flash memory die 220. The reset/power down signal remains deasserted during normal flash memory operation.

In light of the above description, it is noted that the memory device 100 may include any desired control input signals without departing from the principles of this disclosure. Further, one of ordinary skill in the art would immediately recognize that the number and function of the control signals may differ depending on the types of memory (e.g., RAM, flash memory, or other memory type) used. Other control signals may be included as well, to implement additional features as desired.

As shown in FIG. 2, memory device 100 further includes a plurality of logic gates 230, 232, and 234 coupling the ROM select and chip enable signals to the RAM 210 and flash memory 220. Logic gate 230 comprises an inverter, and logic gates 232 and 234 comprise OR gates. OR gate 232 receives the ROM select signal and the chip enable signal and drives the chip enable input terminal 222 of the flash memory 220. Inverter 230 receives the ROM select signal and feeds OR gate 234. OR gate 234 also receives the chip enable signal and drives the chip enable input terminal 212 of the RAM 210.

A conventional memory device containing a single semiconductor die of either RAM or flash memory usually includes a single chip enable terminal. In accordance with standard memory interface protocols, IC 100 is capable of operating based on a single chip enable signal. The logic devices 230, 232, and 234 selectively route the chip enable signal to either the flash memory 220 or the RAM 210, depending on the state of the ROM select signal. When the ROM select signal is asserted to select the flash memory 220, then the chip select signal controls chip enable terminal 222. When the ROM select signal is deasserted to select the RAM 210, then the chip select signal controls chip enable terminal 212; i.e., the flash chip enable terminal 222 is asserted if the ROM select and chip enable signals are asserted. Similarly, the RAM chip enable terminal 212 is asserted if the ROM select signal is deasserted and the chip enable signal is asserted.

Accordingly, IC 100 provides a single-package, dual function memory device that can be cheaply mass produced and integrated into a variety electronic systems. The use of standard memory technologies such as SRAM and flash memory enhances the cost effectiveness of the device, since the semiconductor dies can be constructed using existing transistor-level founding processes. Memory device 100 provides great flexibility to system designers in that the IC 100 can include virtually any type of memory technologies, including the programmable ROM not permitted by some prior art devices. In fact, the IC 100 can incorporate non-standard memory technologies, if so desired. Similarly, housing the memories 210 and 220 in a standard package type having a standard pinout ensures broad compatibility with existing design tools, thus keeping design costs to a minimum. Because both memories are included in one package, the IC 100 is particularly useful for portable systems and other small devices with limited real estate. Such devices may include, for example, laptop computers, PCMCIA devices, cellular phones, personal digital assistants (PDA's), programmable calculators, automotive applications, airline and space systems, portable digital versatile disc (DVD) players, and portable global positioning system (GPS) receivers.

Figure 3:
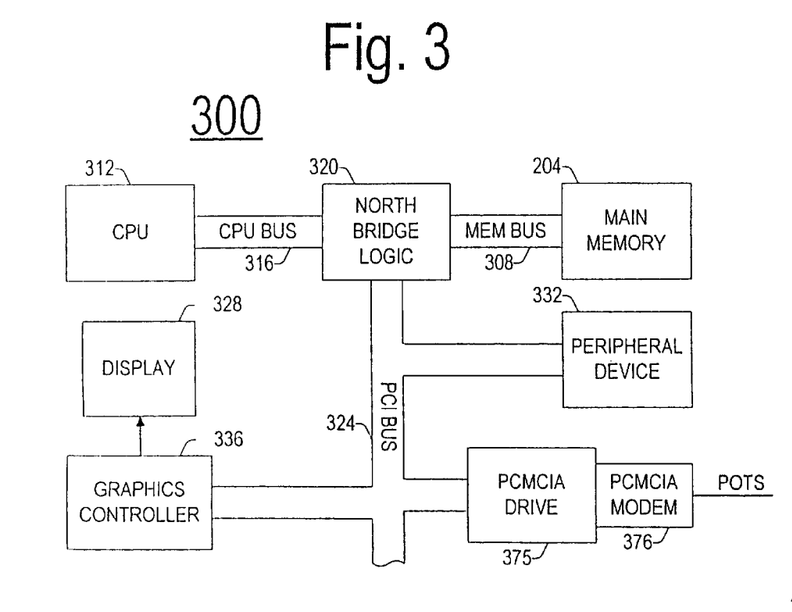
FIG. 3 is the block diagram of a computer system coupled to a PCMCIA modem card that includes the dual function memory device of FIGS. 1 and 2.

FIG. 3 illustrates an exemplary computer system 300 constructed in accordance with a preferred embodiment and generally includes a central processing unit (CPU) 312 coupled to a main memory array 304 and to a variety of other peripheral computer system components through an integrated bridge logic device 320. The bridge logic device 320 is sometimes referred to as a "North bridge" for no other reason than it often is depicted at the upper end of a computer system drawing. The CPU 312 preferably couples to North bridge logic 320 via a CPU bus 316, or the bridge logic 320 may be integrated into the CPU 312. The CPU 312 may comprise, for example, a Pentium® II microprocessor. It should be understood, however, that computer system 300 could include other alternative types of microprocessors. Further, an embodiment of computer system 300 may include multiple processors, with each processor coupled through the CPU bus 316 to the bridge logic unit 320.

The main memory array 304 preferably couples to the bridge logic unit 320 through a memory bus 308, and the bridge logic 320 preferably includes a memory control unit (not shown) that controls transactions to the main memory 304 by asserting the necessary control signals during memory accesses. The main memory 304 functions as the working memory for the CPU 312 and generally includes a conventional memory device or array of memory devices in which program instructions and data are stored. The main memory array may comprise any suitable type of memory such as dynamic random access memory (DRAM) or any of the various types of DRAM devices such as synchronous dynamic random access memory (SDRAM), extended data output dynamic random access memory (EDO DRAM), or Rambus™ dynamic random access memory (RDRAM).

The computer system 300 also preferably includes a graphics controller 336 that couples to the bridge logic 320 via an expansion bus 324. As shown in FIG. 3, the expansion bus 324 comprises a Peripheral Component Interconnect (PCI) bus. Alternatively, the graphics controller 336 may couple to bridge logic 320 through an additional Advanced Graphics Port (AGP) bus (not specifically shown). As one skilled in the art will understand, the graphics controller 336 controls the rendering of text and images on a display device 328. The graphics controller 336 may embody a typical graphics accelerator generally known in the art to render three-dimensional data structures on display 328. These data structures can be effectively shifted into and out of main memory 304 via the expansion bus 324 and bridge logic 320. The graphics controller 336 therefore may be a master of the expansion bus (including either PCI or AGP bus) enabling the graphics controller 336 to request and receive access to a target interface within the bridge logic unit 320, including the memory control unit. This mastership capability permits the graphics controller 336 to access main memory 304 without the assistance of the CPU 312. A dedicated graphics bus accommodates rapid retrieval of data from main memory 304.

As will be apparent to one skilled in the art, the bridge logic 320 includes a PCI interface to permit master cycles to be transmitted and received by bridge logic 320. If an AGP bus is included in the system, the bridge logic 320 also includes an interface for initiating and receiving cycles to and from components on the AGP bus. The display 328 comprises any suitable electronic display device upon which an image or text can be represented. A suitable display device may include, for example, a cathode ray tube (CRT), a liquid crystal display (LCD), a thin film transistor (TFT), a virtual retinal display (VRD), or any other type of suitable display device for a computer system.

Additionally, the computer system 300 includes a PCM-CIA drive 375 coupled to the PCI bus 324. The PCMCIA drive is accessible from the outside of the computer 330 and accepts one or more expansion cards that are housed in special PCMCIA cards, enclosures which are approximately the size of credit cards but slightly thicker. Due to the small size of the PCMCIA card, a PCMCIA device will have a limited amount of available circuit board space for electronic components and signal traces connecting the components. A PCMCIA card typically includes one connector that attaches to the PCMCIA drive 375, and additional connectors may be included for attaching cables or other devices to the card outside of the computer 300. Accordingly, various types of PCMCIA cards are available, including modem cards, network interface cards, and memory expansion cards. A PCMCIA modem 376 is shown attached to the PCMCIA drive 375 in FIG. 3.

In the preferred embodiment of computer system 300, the expansion bus 324 comprises a Peripheral Component Interconnect (PCI) bus. The present invention, however, is not limited to any particular type of expansion bus, and thus various buses may be used, including a high speed (66 MHz or faster) PCI bus. In the preferred embodiment, a plurality of PCI peripheral devices may reside on the PCI bus 324. The PCI devices may include any of a variety of peripheral devices such as, for example, network interface cards (NIC's), video accelerators, audio cards, hard or floppy disk drives, Personal Computer Memory Card International Association (PCMCIA) drives, Small Computer Systems Interface (SCSI) adapters and telephony cards. Although only one PCI peripheral device 332 is depicted in FIG. 3, it should be recognized that computer system 300 may include any number of PCI devices as desired.

The following discussion describing the preferred embodiment of computer system 300 as a laptop computer should not be construed as limiting the present invention to a laptop. The present invention also may be used with a desktop system, work station, server, or handheld computer. In addition and as mentioned above, computer system 300 can be implemented with respect to the particular bus architectures shown in FIG. 3 (i.e., PCI bus), or other bus architectures, as desired. The embodiment described herein, however, assumes that the modem 376 couples to the PCI bus 324, as shown in FIG. 3, and thus the following discussion will focus on configuring the present invention for that embodiment. Further, CPU 312 preferably comprises a Pentium® II processor and thus CPU bus 316 represents a Pentium® II bus. These bus protocols and the terminology used with respect to these protocols are well known to those of ordinary skill in the art. If a more thorough understanding of the PCI, or Pentium® II bus is desired, reference should be made to the *PCI Local Bus Specification* (1993) and *Intel P6 External Bus Specification*. If an AGP bus also is used in the computer system, reference may be made to the *Accelerated Graphics Port Interface Specification* (Intel, 1996).

Figure 4:
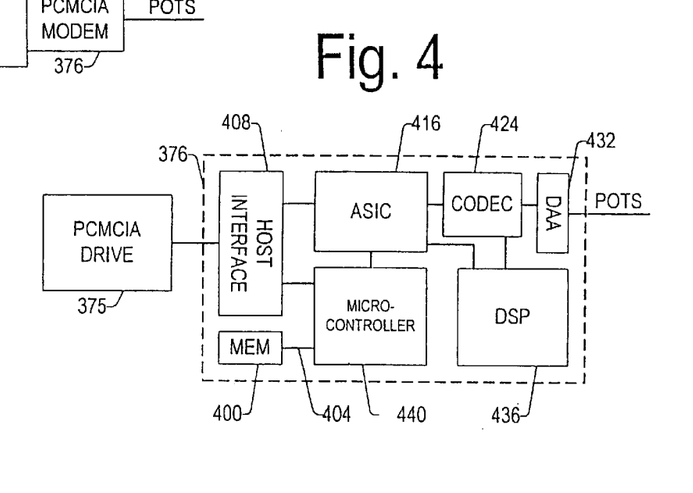
FIG. 4 illustrates the block diagram of the PCMCIA modem of FIG. 3.

A preferred embodiment of PCMCIA modem 376, as illustrated in FIG. 4, generally comprises a host interface 408 that interfaces the PCMCIA drive 375, a microcontroller 440 and associated memory device 400 coupled to the host interface 408, a digital signal processor (DSP) chip 436 coupled to the microcontroller 440, and a coder/decoder (CODEC) 424 coupled to the DSP 436. The CODEC 424 further couples to a data access arrangement (DAA) chip 432 that connects to the telephone line, or "plain old telephone service" (POTS). Modem 376 may also include an Application Specific Integrated Circuit (ASIC) 416 coupled some or all of the devices within the modem 376. Preferably, the ASIC 416 couples to the host interface 376, the microcontroller 440, the DSP 436, and the CODEC 424. The ASIC 416, CODEC 424, DSP 436, and DAA 432 are generally referred to as a "data pump," since these devices "pump" the data into and out of the telephone line from the microcontroller 440.

The general purpose of the modem 376 is to convert the digital data travelling from the PCMCIA drive 375 into analog waveforms carried over the POTS line and to translate the analog waveforms received from the telephone line into digital codes for the PCMCIA drive 375. This analog/digital interface is necessary because microprocessor-based computers such as that shown in FIG. 3 process digital data, while the telephone lines carry data in the form of analog waveforms. Hence, the devices within the modem 376 essentially convert the analog data to digital and the digital data to analog in accordance with standard protocols developed for telephone modem communications.

The host interface 408 preferably comprises a standard Universal-Asynchronous Receiver/Transmitter (UART) for interfacing to the PCMCIA drive 375, which functions as a "host" system to the modem 376. In other embodiments, the host interface may comprise a parallel interface or any other type of serial interface device that is appropriate for interfacing the modem 376 to another host system. The UART may include registers, clock generators, and other devices for temporarily storing and communicating data between the PCMCIA drive 375 and the microcontroller 440. The host interface 408 generally stores data received from the PCMCIA drive 375 in temporary registers until the microcontroller 440 is available to receive the data. Similarly, the host interface 408 temporarily stores data received from the microcontroller 440 until the data can be transmitted to the PCMCIA drive 375.

The ASIC 416 comprises a custom-designed circuit to augment the functions of the microcontroller 440 and DSP 436, such as timing recovery of the incoming data signals from the DAA 432, decoding of addresses received by the host interface 376, clock and timing generation, and any "glue logic" necessary for interconnecting the various devices within the modem 376. The ASIC 416 may also provide relay control, which includes detecting phone line activity such as rings or hang-ups. Inclusion of the ASIC 416 is optional, since these functions may be provided by the microcontroller 440 and DSP 436. Using the ASIC 416 for certain modem functions, however, may simplify and expedite development of software instructions for the microcontroller 440 and DSP 436, however.

The DAA 432 comprises an industry standard interface for the POTS line. The CODEC 424 essentially operates as an analog to digital converter (ADC) and a digital to analog converter (DAC). The CODEC 424 receives analog waveforms from the POTS via the DAA 432 and converts the analog waveforms into a binary, or digital, representation. The digital codes are then transmitted to the DSP 436. Similarly, the CODEC 424 translates digital data received from the DSP 436 into analog waveforms suitable for transmitting over the POTS line. If the ASIC 416 provides timing recovery, then the CODEC 424 may also transmit incoming signals to the ASIC 416.

The DSP 436 preferably comprises a standard digital signal processor chip and provides standard signal processing functions such as digital filtering, equalization, modulation, and demodulation. The filtering and modulation generally prepare the digital data received from the microcontroller 440 for transmission as an analog waveform. Similarly, the filtering and demodulation generally convert the digitized signals received from the CODEC 424 into data suitable for the microcontroller. The equalization calculations may be included to adjust for noisy interference on the POTS line that can degrade the incoming and outgoing analog signals. If the ASIC 416 is not included, then the DSP 436 may provide various functions of the ASIC 416 such as timing recovery and relay control. The DSP 436 also may provide any other desired signal processing functions, including the analog to digital and digital to analog conversion performed by the CODEC 424.

The microcontroller 440 generally comprises a standard microprocessor or microcontroller device for controlling operation of the modem 367 based software instructions stored in the memory device 400. Memory device 400 preferably comprises a single IC, dual function memory device that includes random access memory and flash memory, as shown in FIGS. 1 and 2 and described above. Accordingly, the flash memory holds operating code for the modem 376, while the RAM is available for temporary data storage. The microcontroller 440 performs transactions with either memory via memory bus 404, which includes data, address, and control lines coupled to both memories. Because the memory device 400 incorporates flash memory, the software code can be updated during development or even upgraded in the field.

Conventional microcontroller-based systems, such as modems, generally require a read only memory chip in addition to a random access memory chip. Because modem 376 combines the two types of memory in a single integrated circuit package 400, however, more space is available for other devices on the printed circuit board of the modem. For instance, due to the limited real estate on a PCMCIA card, it may be difficult or impossible to fit an ASIC 416 or other device into the modem card if two memory chips are required. By using the dual function memory chip 400, however, the modem 376 can accommodate a wider variety of components than would be possible if two memory chips were required. As a result, the modem 376 can provide additional functions that would not be possible without the added circuitry. Alternatively, extra circuitry may be added to provide functions performed by the DSP 436 or microcontroller 440, allowing the DSP 436 and microcontroller 440 to process data more efficiently. In addition, inclusion of extra circuitry may permit the use of simpler, and thus less expensive, processors 440 and 436. Hence, use of the dual function memory device 400 instead of a conventional pair of RAM and ROM chips permits a higher level of integration of the various modem functions, possibly resulting in a cheaper and more powerful modem card 376.

Numerous variations and modifications will become apparent to those skilled in the art once the above disclosure is fully appreciated. It is intended that the following claims be interpreted to embrace all such variations and modifications.

I claim:

1. A memory device, comprising:

an integrated circuit package including a plurality of address, data, and control terminals;

a first memory array encapsulated in said integrated circuit package, said first memory array connecting to said terminals via a first set of data, address and control signals;

a second memory array encapsulated in said integrated circuit package, said second memory array connecting to said terminals via a second set of data, address and control signals, wherein the second set of address and data signals directly connect to the first set of address and data signals respectively within the integrated circuit package;

wherein said first and second memory arrays comprise different types of memory technologies; and a select signal coupled to one of said control terminals that selects either said first memory array or said second memory array, wherein said memory device carries out memory operations using said second memory array if the select signal is asserted, and wherein said memory device carries out memory operations using said first memory array if the select signal is deasserted.

2. The memory device of claim 1 wherein said first and second memory arrays are manufactured on separate semiconductor dies.

3. The memory device of claim 2 further including an enable signal coupled to one of said terminals that activates said second memory array if the select signal is asserted, and wherein the enable signal activates said first memory array if the select signal is deasserted.

4. The memory device of claim 3 wherein said first memory device comprises a random access memory array.

5. The memory device of claim 4 wherein said random access memory array comprises a static random access memory array.

6. The memory device of claim 3 wherein said second memory array comprises a read only memory array.

7. The memory device of claim 6 wherein said read only memory array comprises a flash memory array.

8. The memory device of claim 2 wherein said integrated circuit package comprises a thin small outline package.

9. An integrated circuit, comprising:

a random access memory array manufactured on a first semiconductor die;

a read only memory array manufactured on a second semiconductor die;

an integrated circuit package that encloses said random access memory array and said read only memory array, said circuit package including a plurality of data, address, and control terminals;

an address bus connecting said random access memory array and said read only memory array to said address terminals; and a ROM select signal connecting one of said control terminals to said random access memory array and to said read only memory array; and wherein said integrated circuit operates as a random access memory device if said ROM select signal is deasserted and operates as a read only memory device if said ROM select signal is asserted.

10. The integrated circuit of claim 9 further including a data bus that connects said data terminals to said random access memory array and to said read only memory array.

11. The integrated circuit of claim 10 further including a chip enable signal coupled to one of said control terminals, to said random access memory array, and to said read only memory array, wherein asserting the chip enable signal activates said read only memory array if the ROM select signal is asserted or enables said random access memory array if the ROM select signal is deasserted.

12. The integrated circuit of claim 11 wherein said random access memory array comprises a static random access memory array.

13. The integrated circuit of claim 11 wherein said read only memory array comprises a flash memory array.

14. The integrated circuit of claim 11 wherein said integrated circuit package comprises a thin small outline package.

15. A computer system, comprising:

a processor capable of executing program instructions;

a main memory device coupled to said processor, said main memory device capable of storing data and program instructions;

a primary expansion bus coupled to said processor and said main memory device; and a peripheral device coupled to said primary expansion bus, comprising:

a microcontroller; and a dual function memory chip coupled to said microcontroller comprising a random access memory array and a read only memory array, said dual function memory chip configured to selectively operate either as said random access memory or as said read only memory; and wherein said dual function memory chip includes a plurality of address and data signals directly connected to both said random access memory array and said read only memory array and a select signal for choosing whether said dual function memory chip operates as a random access memory or as a read only memory device.

16. The computer system of claim 15 wherein said random access memory array and said read only memory array are manufactured on separate semiconductor dies.

17. The computer system of claim 16 wherein said peripheral device comprises a modem.

18. The computer system of claim 16 wherein said peripheral device is mounted on a PCMCIA card.

19. The computer system of claim 16 wherein said dual function memory device includes an integrated circuit package enclosing said random access memory array and said read only memory array.

20. The computer system of claim 19 wherein said standard integrated circuit package comprises a thin small outline package.

21. A microcontroller-based system mounted an a printed circuit card, comprising:

a programmable microcontroller capable of executing program instructions; and a memory device coupled to said microcontroller, said memory device capable of selectively operating either as a random access memory or a read only memory, comprising:

an integrated circuit package comprising a plurality of data, address, and control terminals;

a first semiconductor die enclosed within said integrated circuit package, said first semiconductor die being said random access memory array;

a second semiconductor die enclosed within said integrated circuit package, said second semiconductor die being said read only memory array and directly connected to said first semiconductor die via data and address lines, wherein said data and address lines also couple to said terminals; and a select signal coupling one of said control terminals to said random access memory array and said read only memory array; and wherein said memory device operates as said read only memory if the select signal is asserted and operates as said random access memory if the select signal is deasserted.

22. The system of claim 21 including a chip enable signal that connects said random access memory array and said read only memory array to one of said terminals, wherein the chip enable signal enables said read only memory array if the select signal is asserted and enables said random access memory array if the select signal is deasserted.

23. The system of claim 22 wherein said system comprises a modem.

24. The system of claim 23 wherein said printed circuit card comprises a PCMCIA card.

25. The system of claim 22 wherein said random access memory array comprises a static RAM array.

26. The system of claim 22 wherein said read only memory array comprises a flash memory array.

* * * * *